(12) United States Patent
Ematrudo

(10) Patent No.: US 6,195,309 B1
(45) Date of Patent: Feb. 27, 2001

(54) TIMING CIRCUIT FOR A BURST-MODE ADDRESS COUNTER

(75) Inventor: Christopher Ematrudo, Campbell, CA (US)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/320,427

(22) Filed: May 26, 1999

(51) Int. Cl.[7] ........................................ G11C 8/00
(52) U.S. Cl. ................... 365/236; 365/230.09; 365/233; 327/291; 327/294
(58) Field of Search ..................... 365/236, 194, 365/233, 230.09, 189.05, 189.08; 327/291, 293, 294, 299

(56) References Cited

U.S. PATENT DOCUMENTS

| | | |
|---|---|---|
| 5,452,261 | 9/1995 | Chung et al. . |
| 5,526,320 | 6/1996 | Zagar et al. . |
| 5,668,773 | 9/1997 | Zagar et al. . |
| 5,706,247 | 1/1998 | Merritt et al. . |
| 5,708,688 | 1/1998 | Ting et al. . |
| 5,805,523 * | 9/1998 | Lysinger ........................... 365/230.08 |
| 5,808,961 * | 9/1998 | Sawada ................................ 365/233 |
| 5,815,462 * | 9/1998 | Konishi et al. ....................... 365/233 |

* cited by examiner

*Primary Examiner*—Son T. Dinh
*Assistant Examiner*—Hien Nguyen
(74) *Attorney, Agent, or Firm*—Jiawei Huang; J.C. Patents

(57) ABSTRACT

A burst-mode capable RAM chip includes a timing circuit for clocking a burst counter during a burst transfer. In response to an input indicating the beginning of the burst transfer, the timing circuit generates a first signal that loads the initial address of the burst transfer into the latches of a burst counter. Then, the timing circuit generates a second signal to increment the burst counter to the second address in the burst transfer after the load of the initial address has successfully completed but prior to the second clock cycle. Finally, the timing circuit generates subsequent signals to increment the burst counter through the remaining addresses of the burst transfer. Each of the subsequent signals is generated in response to an input from the system clock.

11 Claims, 4 Drawing Sheets

TIMING CIRCUIT FOR A BURST-MODE ADDRESS COUNTER

FIELD OF THE INVENTION

The present invention relates generally to burst-mode capable random access memory, and more specifically to a burst-address timing circuit for a burst-mode capable random access memory chip.

BACKGROUND OF THE INVENTION

It seems that today, the most compelling desire in the computer industry is the desire for improved performance. Engineers and designers are continually attempting to extract the most speed from each component in a computer system. One computer component which receives much attention by computer system designers is random access memory (RAM) chips. RAM chips are used within a computer system as volatile information storage while the computer is processing. Information is stored in the RAM chips using a matrix-type addressing scheme. A unique hexadecimal address is associated with each storage location on the RAM chip.

To access the information, another computer component, such as a central processing unit (CPU), provides to a RAM chip an address for the desired information and an indication that the information will be read from or written to the RAM chip. Often, large blocks of contiguous information are read from or written to a RAM chip in sequential order. For instance, the CPU may read four contiguous 64-bit words or blocks of information (a "sequential data transfer") from the RAM chip. In the traditional manner, the CPU performs four separate memory accesses to read each of the four blocks of information. Each memory access would include providing the RAM chip with an address for the current block of information, and then issuing a read command. The step of providing to the RAM chip the addresses for each successive block of information in the sequential data transfer creates a performance limitation. The need for the requesting component, the CPU in this example, to provide each successive address slows the overall data access for such a sequential data transfer.

Burst-mode data transfer is one attempt to improve the performance of memory access during a sequential data transfer. To enable a burst-mode data transfer, the RAM chip is modified to include a burst-mode address counter or "incrementer" (the "burst counter"). The purpose of the burst counter is to internally increment the address of the current data transfer so that the requesting component need not provide each sequential address. The burst counter allows another computer component, such as the CPU, to merely provide to the RAM chip the starting address for the burst transfer and an instruction to perform a burst transfer. The RAM chip begins providing to the CPU the information at the starting address, and the burst counter internally generates the addresses for each successive memory location in the sequential data transfer. The burst counter increments the current address to the next successive address at each clock cycle. Those skilled in the art will appreciate that the burst counter may be configured to operate in an "interleave" mode in which the address generated by the burst counter may not necessarily be the next successive address. However, for simplicity, the following discussion will focus on the generation of successive addresses. Those skilled in the art will appreciate that the invention is equally applicable to interleaved addressing. Burst-mode enabled RAM chips greatly improve the overall performance of a computer system by reducing the overhead associated with accessing sequential information stored on the RAM chip.

To perform most efficiently, the RAM chip should be capable of providing each successive address location in the burst transfer as quickly as possible. Toward that end, the burst counter should be capable of providing the RAM chip with the second sequential address in the burst transfer as early as possible. The RAM chip may need the second of the sequential addresses as early as the end of the initial clock cycle. Existing technologies for generating sequential addresses fall short of an ideal solution. For instance, one attempt to provide the second of the sequential addresses is to use an incrementer between the externally provided initial address and the latches of the burst counter. In that manner, the initial address is incremented prior to being loaded into the burst counter. However, that solution is costly in terms of the surface area needed for additional components on the RAM chip, i.e., the additional incrementer. Another solution is to load the initial address into the burst counter in the first clock cycle, and then increment the burst counter with the second clock cycle. That solution is costly in terms of the performance loss of not having the second sequential address by the end of the first clock cycle.

Accordingly, there is a need in the art for a circuit to control the load and increment of the latches of a burst counter on a burst-mode capable RAM chip which is capable of both loading an initial address and incrementing that initial address within the first clock cycle.

SUMMARY OF THE INVENTION

The present invention overcomes the limitations identified above by providing an improved timing circuit for a burst-mode address counter. Generally speaking, a burst-mode capable RAM chip includes a timing circuit for clocking a burst counter during a burst transfer. In response to an input signal indicating the beginning of the burst transfer, the timing circuit generates a first signal that loads the initial address of the burst transfer into the latches of a burst counter. Then, the timing circuit generates a second signal to increment the burst counter to the second address in the burst transfer after the load of the initial address has successfully completed but prior to the second clock cycle. Finally, the timing circuit generates subsequent signals to increment the burst counter through the remaining addresses of the burst transfer. Each of the subsequent signals is generated in response to an input signal from the system clock.

More specifically, the input signal indicating the beginning of the burst transfer is directly used to load the initial address of the burst transfer into the burst counter. That input signal is also fed to the timing circuit which generates clocking signals to increment the burst counter through each of the successive addresses of the burst transfer. The timing circuit provides two circuit paths to generate those clocking signals. A first circuit path is used to generate a first clocking signal to increment the burst counter. A second circuit path is used to generate each successive clocking signal. The timing circuit selects which circuit path to activate based on the state of the input indicating the beginning of the burst transfer. When that input signal is active, the timing circuit enables the first circuit path and disables the second circuit path. When that input signal is inactive, the timing circuit enables the second circuit path and disables the first circuit path.

In one embodiment, the first circuit path generates a clocking signal that is slightly time-delayed with respect to the system clock so that the burst counter has time to load the initial address of the burst transfer. The initial address is loaded in response to the input indicating the beginning of the burst transfer. Then, the timing circuit, via the first circuit path, generates the first clocking signal to increment the burst counter. In this manner, the second address of the burst transfer is available prior to the second clock cycle. In addition, each subsequent address of the burst transfer is generated in response to the system clock. Consequently, the present invention makes possible a RAM chip that is capable of loading an initial address and incrementing that address within a single clock cycle. More importantly, this result is achieved without an additional incrementer to pre-increment the initial address before loading the burst counter.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
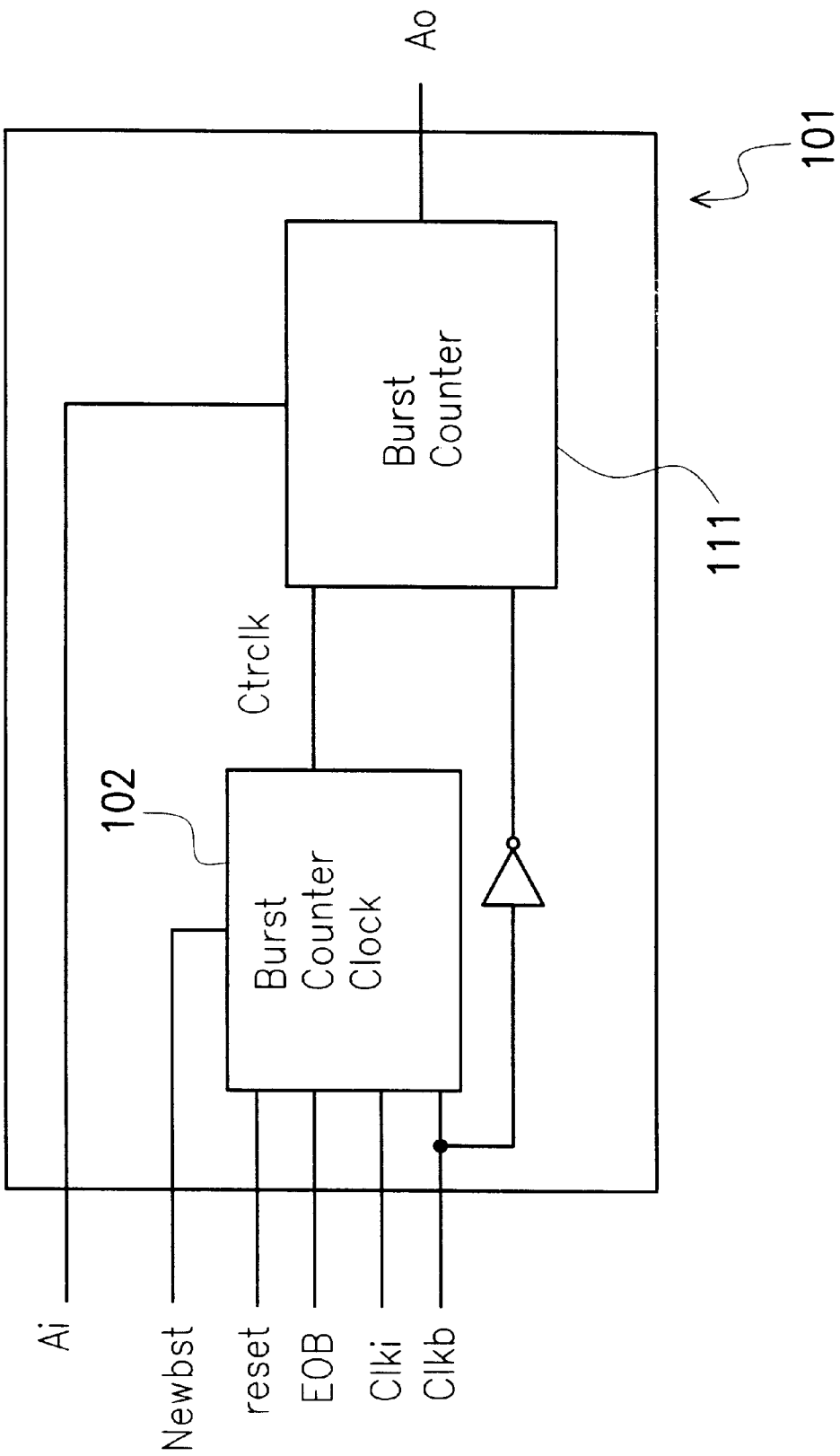
FIG. 1 is a functional block diagram of a burst addressing circuit portion of a RAM chip constructed in accordance with one embodiment of the present invention.

FIG. 1 is a functional block diagram of a burst address circuit 101 of a RAM chip (not shown). The burst address circuit 101 generates addresses for each successive memory location in a burst mode data transfer. During the burst transfer, the burst address circuit 101 increments the current address of the RAM chip from the initial address of the burst transfer ($A_i$) through each successive memory location of the burst transfer.

The two major components of the burst address circuit 101 are a burst counter clock 102 and a burst counter 110. The burst counter 110 has three input signals: the signal Ctrclk from the burst counter clock 102, the inverted input Clkb generated by the RAM chip from an external signal, and the initial address $A_i$ from the external system. The signal Ctrclk is an output from the burst counter clock 102. The burst counter 110 has an output $A_o$, which is the address of the current memory location being accessed.

In this embodiment, the burst counter clock 102 has five input signals: the input Newbst, the input Reset, the input EOB, the input Clki, and the input Clkb. Input Clki is an inverted internal version of the external system clock. Input Clkb is an active high pulse that indicates that a load of the initial address $A_i$ must occur. The input Clkb initiates the burst transfer. The input Clkb is a signal generated internally by decoding a signal or signals from an external system component, such as the CPU (not shown) or other memory manager, indicating that the external system component is requesting a burst transfer. Input Newbst is a signal generated in response to an external signal or signals indicating the beginning of a burst transfer. Input EOB is an internally generated signal indicating the end of the burst data transfer. The burst counter clock 102 outputs the signal Ctrclk, which triggers the latches of the burst counter 110 to be incremented.

In operation, the external system provides to the RAM chip, which provides to the burst-address circuit 101, the initial address $A_i$ of a burst transfer. In addition, the RAM chip activates the input Clkb to initiate the burst transfer. The inverted input Clkb causes the burst counter 110 to latch the initial address $A_i$. As will be apparent to those skilled in the art, elsewhere in the RAM chip the information stored at the initial address $A_i$ is made available for access, or information is written to the initial address $A_i$.

Also in response to the input Clkb, but after the initial address $A_i$ is latched, the burst counter clock 102 generates the signal Ctrclk. The signal Ctrclk is delayed a sufficient time later than the input Clkb, but prior to the second clock cycle, that the initial address $A_i$ is latched within the burst counter 110 before the signal Ctrclk is generated. The burst counter 110 responds to the signal Ctrclk by incrementing its latches, thereby generating the second successive address of the burst transfer prior to the second clock cycle. The generation of the signal Ctrclk is discussed in detail below. As a result, the output $A_o$ of the burst counter 110 reflects the second address of the burst transfer prior to the end of the first clock cycle. In this manner, the RAM chip is able to make the memory location identified by the second address available for access during the second clock cycle, rather than the third clock cycle. One key to making the second address available prior to the second clock cycle is the act of causing the burst counter 110 to increment its latches after the initial address $A_i$ is latched, but prior to the second clock cycle. That result is achieved within the burst counter clock 102, which is discussed in greater detail below.

Figure 2:
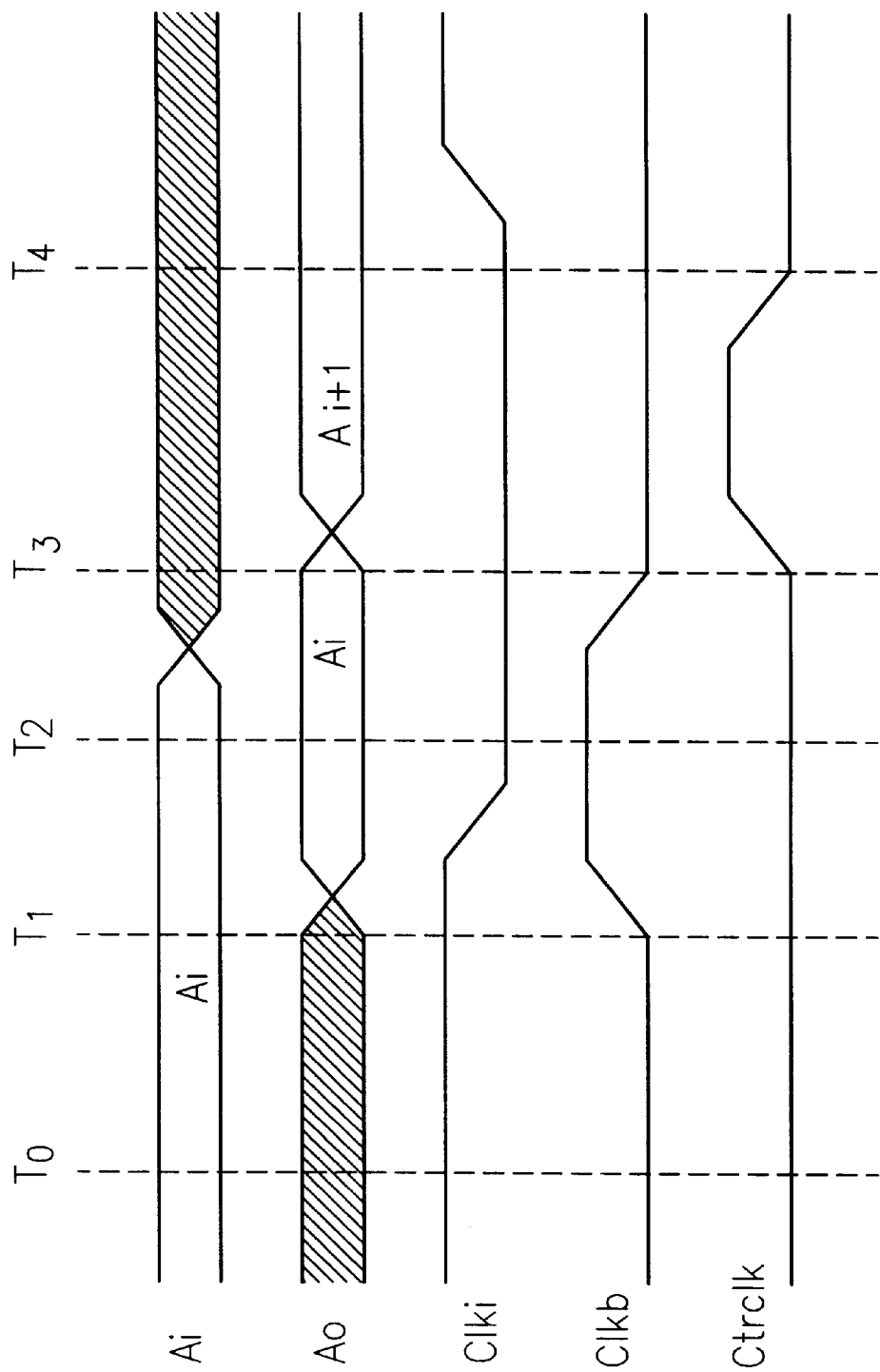
FIG. 2 is a timing diagram of the burst addressing circuit illustrated in FIG. 1 and constructed in accordance with the present invention.

FIG. 2 is a timing diagram of the states for the relevant signals within the burst address circuit 101. FIG. 1, taken in conjunction with the timing diagram of FIG. 2, illustrates the operation of the burst address circuit 101. To begin the burst transfer, an external system component, such as the CPU (not shown) provides the initial address $A_i$ to the address buffer (not shown) of the RAM chip, which in turn provides the initial address $A_i$ to the burst counter 110 of the burst address circuit 101. In FIG. 2, the vertical dashed lines indicate particular times of interest, as described below. As shown in FIG. 2, each of the operative signals has the following initial states at $T_0$ when the burst transfer begins. The initial address $A_i$ is valid to the burst address circuit 101. The output address $A_o$ is unknown. Because the output address $A_o$ is only used for a burst transfer, its value is irrelevant prior to beginning the burst transfer. The system clock Clki is high. The input Clkb is low, and the signal Ctrclk is low.

At $T_1$ the input Clkb is asserted to initiate the burst transfer. The input Clkb is asserted in response to a signal from the external system component that provided the initial address $A_i$ for the burst transfer. Asserting the input Clkb causes the burst counter 110 to latch the initial address $A_i$ through to the burst counter output $A_o$. Accordingly, at $T_2$ the output $A_o$ of the burst address circuit 101 is the initial address $A_i$.

In accordance with the disclosed embodiment, the input Clkb is also provided to the burst counter clock 102. In response to the input Clkb, the burst counter clock 102 generates an output Ctrclk which is input to the burst counter 110. The circuitry of the burst counter clock 102, discussed in greater detail below, is designed so that the signal Ctrclk is generated once by the falling edge of input Clkb, which provides enough time for the burst counter 110 to complete its load of the initial address $A_i$. The signal Ctrclk is generated again in response to the falling edge of the system clock Clki for each successive memory address in the burst transfer. As is discussed in greater detail below, the path of the signal Clki into the timing circuit is disabled while the input Newbst is active. Those skilled in the art will appreciate that the number of successive memory addresses for the burst transfer may be pre-configured in other circuitry (not shown) to trigger the input EOB and discontinue the burst transfer.

Accordingly, at $T_3$, on the falling edge of input Clkb, the burst counter clock 102 generates the signal Ctrclk. The signal Ctrclk is input to the burst counter 110 and causes the burst counter 110 to increment its internal address registers (latches) and thus generate the second sequential memory address ($A_{i+1}$) in the burst transfer. The component selection of the burst counter clock 102 causes the signal Ctrclk to be generated prior to the second cycle of the system clock CLki. Therefore, at $T_4$, the burst counter 110 has incremented its internal address registers to the second address ($A_{i+1}$) in the burst transfer, and the burst counter 110 output $A_o$ reflects that address.

On the second clock cycle, the input Newbst is not active, and therefore, the falling edge of the system clock Clki causes the burst counter clock 102 to generate the signal Ctrclk. In this fashion, each falling edge of the system clock Clki causes the burst counter clock 102 to generate the signal Ctrclk and increment the burst counter 110 through each successive address in the burst transfer. Each of those addresses is provided by the burst counter 110 at output $A_o$ and used by the RAM chip to allow the access to the memory locations identified by each of those addresses.

In summary, when a burst transfer is initiated, the external system provides the initial address $A_i$ of the burst transfer to the burst counter 110 and latches that address with the input Clkb. In response to the input Clkb, the burst counter clock 102 generates the signal Ctrclk to increment the latches of the burst counter 110 immediately after the load of the initial address $A_i$. The first Ctrclk signal causes the burst counter 110 to generate the second successive address for the burst transfer prior to the second clock cycle, thereby making the memory location accessible at that address available for the second clock cycle. After the first signal Ctrclk, the burst counter clock 102 generates subsequent Ctrclk signals in response to the falling edge of the system clock input Clki.

Figure 3:
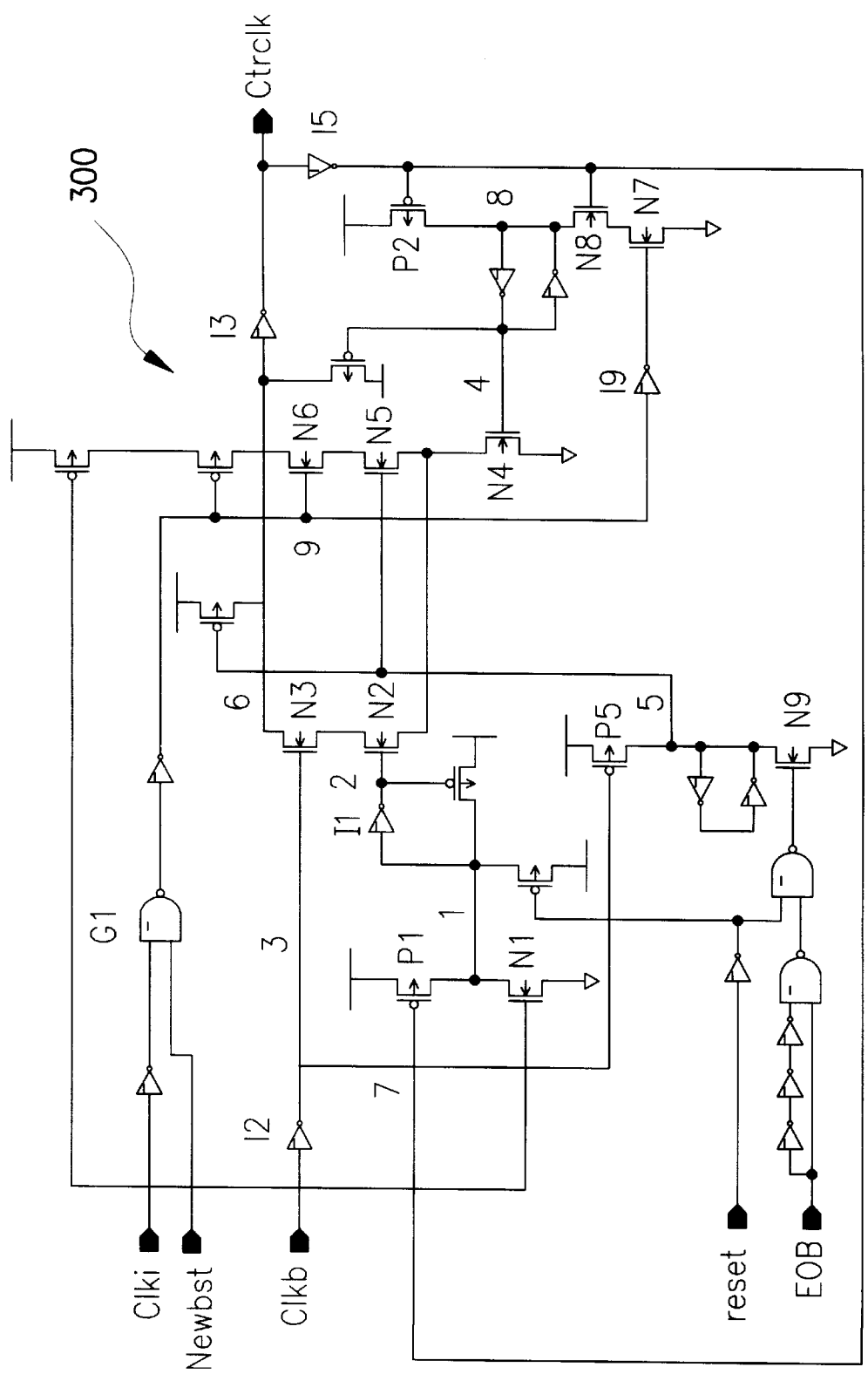
FIG. 3 is a schematic of a burst counter clock timing circuit constructed in accordance with the present invention.

FIG. 3 is a schematic of one embodiment of the present invention illustrating a timing circuit 300 for the burst counter clock 102. The inputs and output of the timing circuit 300 correspond to the inputs and output of the burst counter clock 102 shown in FIG. 1. The timing circuit 300 is responsible for generating the signal Ctrclk once in response to the input Clkb being activated, and then generating the signal Ctrclk again for each falling edge of the system clock Clki. The burst counter 110 increments its address counter to the next sequential address in response to each Ctrclk signal.

To achieve the result just described, the timing circuit 300 provides two paths for activating the signal Ctrclk. The path involving the NFET stack of N2 and N3, in conjunction with NFET N4, is the path utilized during the first clock cycle, when the input Newbst is at logic level low. The path involving the NFET stack of N5 and N6, in conjunction with NFET N4, is the path utilized for all other clock cycles.

Describing now the operation of the circuit, when the input Newbst goes to the logic low level, node 9 goes to the logic low level regardless of the state of input Clki. Accordingly, the path of input Clki into the NFET stack of N5 and N6 is disabled so long as input Newbst is active low. As mentioned above, the input Newbst is an internal signal generated by decoding an external signal or signals indicating the beginning of the burst transfer. The input Newbst goes to the logic low level in response to that external signal, and returns to the logic high level when that signal is removed.

When node 9 is at the logic low level, that signal is inverted by inverter I9 to a logic high level which enables NFET N7. The initial state of the signal Ctrclk is logic low level, which, when passed through inverter I5 enables NFET N8 and brings node 8 to a logic low level. The logic low level at node 8 is inverted by inverter I4 thus enabling NFET N4. When input Clkb goes to the logic high level, that signal enables NFET N1 which then pulls node 1 to a logic low level. The logic low level at node 1 is passed through inverter I1 which pulls node 2 to a logic high level and enables NFET N2.

The logic high level at input Clkb is also passed through inverter I2 pulling node 3 to a logic low level, disabling NFET N3. As mentioned previously, while input Clkb is active (logic high level), the initial address $A_i$ of the burst transfer is loaded into the latches of the burst counter 110. When input Clkb goes inactive (logic low level) the load of the latches is complete. When the load of the latches is complete, the timing circuit 300 generates the signal Ctrclk to increment those latches. Generating that signal is accomplished on the falling edge of input Clkb. When Clkb goes to a logic low level, that signal is passed through inverter I2 which pulls node 3 to a logic high level. The logic high level at node 3 enables NFET N3, which turns on the NFET stack of N2 and N3. When the NFET stack of N2 and N3 is enabled, node 6 goes to a logic low level which, when passed through inverter I3, generates a pulse at signal Ctrclk.

The pulse at signal Ctrclk also acts as a reset to the timing circuit 300. When the signal Ctrclk reaches the logic high level, that signal passes through inverter I5 creating a logic low level at node 7. The logic low level at node 7 enables PFET P1 creating a logic high level at node 1. The logic high level at node 1 is passed through inverter I1 creating a logic low level at node 2. The logic low level at node 2 disables NFET N2, and hence the NFET stack of N2 and N3.

The logic high level of signal Ctrclk is passed through inverter I5 to create a logic low level at PFET P2. The logic low level enables PFET P2 creating a logic high level at node 8. The logic high level at node 8 is passed through inverter I4 creating a logic low level at node 4. The logic low level at node 4 disables NFET N4, creating a logic high level at node 6. The logic high level at node 6 is passed through inverter I3 to terminate the signal Ctrclk. The result is a short crisp pulse at signal Ctrclk to increment and propagate the initial burst address $A_i$ prior to the start of the next clock cycle.

For subsequent clock cycles, input Newbst remains at the logic high level, which enables the system clock input Clki to control the NFET stack of N5 and N6. When the system clock input Clki goes to a logic low level, that signal creates a logic high level at node 9 which enables NFET N6. NFET N5 is enabled by a logic high level at node 5 created during the first clock cycle when PFET P5 was enabled. Accordingly, when the NFET stack of N5 and N6 is enabled, node 6 goes to a logic low level, which, when inverted by inverter I3, creates the second Ctrclk signal to increment and propagate the next address in the burst transfer. The second Ctrclk signal again resets the timing circuit 300 as previously discussed. This cycle is repeated in response to each Clki input signal until the burst transfer is terminated.

The burst transfer is terminated by activating the input EOB, which enables NFET N9 to bring node 5 back to a logic low level, completing the burst transfer. The input EOB may be generated by an external system component or by the RAM chip itself. For example, the size of burst transfers (in blocks of memory accessed per burst) is often pre-configured. Accordingly, the RAM chip may contain additional circuitry, not shown, to tabulate the number of memory blocks transferred during each burst transfer and automatically generate the input EOB in response to the transfer of the pre-configured number of memory blocks.

Figure 4:
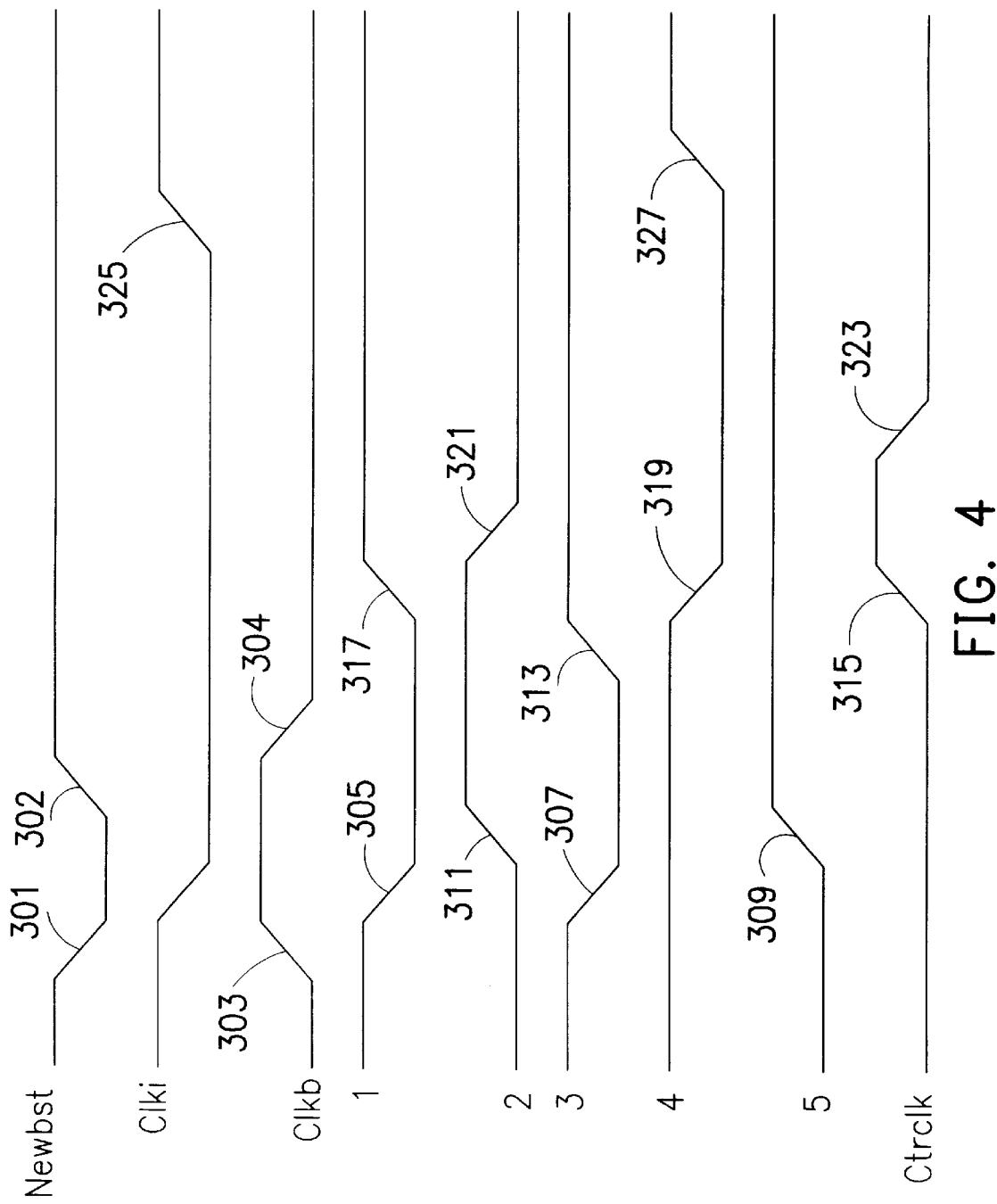
FIG. 4 is a timing diagram of the essential signals generated by the embodiment of the burst counter clock illustrated in FIG. 3.

FIG. 4, taken in conjunction with FIG. 3, illustrates waveforms associated with the logic levels of several of the nodes of the timing circuit 300 during operation. The nodes referred to in this discussion of FIG. 4 correspond to the nodes illustrated in the timing circuit 300 of FIG. 3. To begin, the timing circuit 300 is in its initial state and awaiting the input Clkb to indicate a burst transfer. In short, in the initial state the input Clki is at the logic high level, input Newbst is at the logic high level, input Clkb is at the logic low level, node 1 is at the logic high level, node 2 is at the logic low level, node 3 is at the logic high level, node 4 is at the logic high level, node 5 is at the logic low level, and signal Ctrclk is at the logic low level.

When the RAM chip receives an external signal indicating a burst transfer, that external signal is decoded and used to generate inputs Newbst and Clkb. Consequently, that external signal causes a falling edge 301 on input Newbst, and a rising edge 303 on input Clkb. The rising edge 303 of input Clkb triggers a falling edge 305 on node 1 by turning on NFET N1. The rising edge 303 of input Clkb also triggers a falling edge 307 on node 3 via inverter I2, which in turn causes a rising edge 309 on node 5 by turning on PFET P5. The falling edge 305 of node 1, when inverted by inverter I1, triggers a rising edge 311 on node 2. Therefore, while the input Clkb is active high, the logic level of the relevant nodes is as follows: node 1 is at a logic low level, node 2 is at a logic high level, node three is at a logic low level, node 4 is at a logic high level, and node 5 is at a logic high level.

When input Clkb returns to a logic low state, the falling edge 304 of input Clkb triggers a rising edge 313 on node 3 via inverter I2. The rising edge 313 of node 3 enables NFET N3, causing the NFET stack of N2 and N3 to discharge at node 6, which when inverted by inverter I3 produces a rising edge 315 on the signal Ctrclk. Therefore, immediately after the input Clkb returns to a logic low level, the logic level of the relevant nodes is as follows: node 1 is at a logic low level, node 2 is at a logic high level, node 3 is at a logic high level, node 4 remains at a logic high level, node 5 remains at a logic high level, and the signal Ctrclk is now at a logic high level.

The rising edge 315 of the signal Ctrclk initiates a reset of the circuit 300. By enabling PFETs P1 and P2, the rising edge 315 of the signal Ctrclk triggers a rising edge 317 on node 1 and a falling edge 319 on node 4, respectively. The rising edge 317 of node 1 causes a falling edge 321 on node 2 which disables NFET N2 and, thereby, the NFET stack of N2 and N3. By disabling the NFET N4, the falling edge 319 of node 4 causes node 6 to rise thus producing a falling edge 323 on the signal Ctrclk, thus completing the pulse of signal Ctrclk.

The rising edge 325 of the inverted system clock Clki causes a rising edge 327 on node 4, which completes the self-resetting cycle. Node 5 remains at a logic high level until reset at the end of the burst transfer. The falling edge 302 of input Newbst, via NAND gate G1, enables the path of input Clki into the NFET stack of N5 and N6, which allows the input Clki to generate each subsequent Ctrclk signal and increment the burst counter 110 through each successive memory address of the burst transfer.

In this way, the timing circuit 300 is able to generate, in response to the input Clkb, the clocking signal Ctrclk once to increment the latches of the burst counter 110 prior to the second clock cycle but after the initial address $A_i$ is loaded. Accordingly, the second successive memory address in a burst transfer is available at output $A_o$ by the end of the first clock cycle, thus eliminating the performance decrease of incrementing the address during the second clock cycle and without adding an additional space-consuming incrementer for the initial address $A_i$.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A timing circuit in a RAM chip for generating a clocking signal to increment an address counter, the timing circuit being responsive to an input signal indicating the beginning of a burst-mode data transfer in the RAM chip, comprising:
   a first circuit path configured to generate the clocking signal at a pre-configured time delay after receiving the input signal, the pre-configured time delay being sufficient to allow an initial address to be loaded into the address counter;
   a second circuit path operative to generate the clocking signal in response to a system clock input; and
   a switching circuit responsive to the input signal and operative to disable the second circuit path while the input signal is active and enable the second circuit path prior to a second occurrence of the system clock input.

2. The timing circuit of claim 1, wherein the switching circuit is further operative to disable the first circuit path and enable the second circuit path while the input signal is inactive.

3. The timing circuit of claim 1, wherein the first circuit path is configured to generate the clocking signal in response to receiving the input signal at the pre-configured time delay.

4. The timing circuit of claim 1, wherein the first circuit path comprises a first NFET stack electrically coupled to the input signal.

5. The timing circuit of claim 4, wherein the second circuit path comprises a second NFET stack electrically coupled to the system clock input.

6. The timing circuit of claim 5, wherein the switching circuit is operative to disable the second NFET stack while the input signal is active.

7. The timing circuit of claim 5, wherein the first NFET stack and the second NFET stack are configured in parallel.

8. The timing circuit of claim 7, wherein the first NFET stack is enabled by a first transition of the input signal and the second NFET stack is disabled by the first transition of the input signal, and wherein the first NFET stack generates an electrical pulse in response to a second transition of the input signal and the second NFET stack is enabled by the second transition of the input signal.

9. The timing circuit of claim 1, wherein the switching circuit enables the first circuit path in response to a first transition of the input signal, the switching circuit disables the second circuit path in response to the first transition of the input signal, and the switching circuit causes the first circuit path to generate an electrical pulse in response to a second transition of the input signal.

10. The timing circuit of claim 9, wherein the pre-configured time delay is the length of time between the first transition of the input signal and the second transition of the input signal.

11. The timing circuit of claim 10, wherein the second transition of the input signal occurs prior to a second occurrence of the system clock input.

* * * * *